United States Patent
Yamada et al.

(10) Patent No.: US 9,806,005 B2
(45) Date of Patent: Oct. 31, 2017

(54) ELECTRONIC ELEMENT MOUNTING SUBSTRATE AND ELECTRONIC DEVICE

(71) Applicant: KYOCERA Corporation, Kyoto-shi, Kyoto (JP)

(72) Inventors: Hiroshi Yamada, Kyoto (JP); Takuji Okamura, Kyoto (JP); Akihiko Funahashi, Kyoto (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 15/304,889

(22) PCT Filed: Apr. 14, 2015

(86) PCT No.: PCT/JP2015/061456
§ 371 (c)(1),
(2) Date: Oct. 18, 2016

(87) PCT Pub. No.: WO2015/163192
PCT Pub. Date: Oct. 29, 2015

(65) Prior Publication Data
US 2017/0186672 A1    Jun. 29, 2017

(30) Foreign Application Priority Data

Apr. 23, 2014   (JP) ................................ 2014-089269

(51) Int. Cl.
*H01L 23/495* (2006.01)
*H01L 23/043* (2006.01)
(Continued)

(52) U.S. Cl.
CPC ...... *H01L 23/49531* (2013.01); *H01L 23/043* (2013.01); *H01L 23/49541* (2013.01);
(Continued)

(58) Field of Classification Search
CPC ... H01L 31/0203; H01L 33/60; H01L 33/641; H01L 33/642
See application file for complete search history.

(56) References Cited

U.S. PATENT DOCUMENTS

2002/0119658 A1  8/2002 Honda et al.
2003/0071342 A1  4/2003 Honda et al.
(Continued)

FOREIGN PATENT DOCUMENTS

JP    2003-189195 A    7/2003
JP    2005-191448 A    7/2005
(Continued)

OTHER PUBLICATIONS

International Search Report, PCT/JP2015/061456, dated Jun. 23, 2015, 2 pgs.

*Primary Examiner* — Dung Le
(74) *Attorney, Agent, or Firm* — Volpe and Koenig, P.C.

(57) ABSTRACT

An electronic element mounting substrate includes: a first wiring substrate configured to be a frame defining an interior portion as a first through-hole, the first wiring substrate including a lower surface including an external circuit connection electrode; a metal plate disposed on the lower surface of the first wiring substrate so as to cover an opening of the first through-hole, an outer edge thereof being located between an outer edge of the first wiring substrate and an inner edge of the first wiring substrate, an electronic element mounting portion being disposed in a region of an upper surface of the metal plate which region is surrounded by the first wiring substrate; and a second wiring substrate which is disposed in a peripheral region of the metal plate on the lower surface of the first wiring substrate and is electrically connected to the external circuit connection electrode.

8 Claims, 7 Drawing Sheets

(51) Int. Cl.
*H01L 27/146* (2006.01)
*H01L 23/00* (2006.01)

(52) U.S. Cl.
CPC ........ *H01L 24/49* (2013.01); *H01L 27/14618* (2013.01); *H01L 27/14636* (2013.01); *H01L 2224/2919* (2013.01); *H01L 2224/29139* (2013.01); *H01L 2224/32245* (2013.01); *H01L 2224/48091* (2013.01); *H01L 2224/48106* (2013.01); *H01L 2224/48227* (2013.01); *H01L 2224/73265* (2013.01); *H01L 2924/01022* (2013.01); *H01L 2924/01024* (2013.01); *H01L 2924/01025* (2013.01); *H01L 2924/01028* (2013.01); *H01L 2924/01042* (2013.01); *H01L 2924/01047* (2013.01); *H01L 2924/01074* (2013.01); *H01L 2924/01079* (2013.01); *H01L 2924/1579* (2013.01); *H01L 2924/15151* (2013.01); *H01L 2924/15724* (2013.01); *H01L 2924/15747* (2013.01); *H01L 2924/15787* (2013.01); *H01L 2924/1616* (2013.01); *H01L 2924/17151* (2013.01); *H01L 2924/3512* (2013.01); *H01L 2924/35121* (2013.01)

(56) References Cited

U.S. PATENT DOCUMENTS

| | | | |
|---|---|---|---|
| 2006/0249835 | A1 | 11/2006 | Miyauchi |
| 2010/0301474 | A1* | 12/2010 | Yang .................. H01L 21/6835 257/737 |
| 2012/0037935 | A1* | 2/2012 | Yang .................. H01L 31/0203 257/98 |

FOREIGN PATENT DOCUMENTS

| | | |
|---|---|---|
| JP | 2006-303400 A | 11/2006 |
| JP | 2011-060920 A | 3/2011 |

* cited by examiner

ELECTRONIC ELEMENT MOUNTING SUBSTRATE AND ELECTRONIC DEVICE

TECHNICAL FIELD

The present invention relates to an electronic element mounting substrate on which an electronic element, for example, an electronic component including an imaging element of a CCD (Charge Coupled Device) type or a CMOS (Complementary Metal Oxide Semiconductor) type, or a light emitting element such as an LED (Light Emitting Diode) is mounted, and an electronic device.

BACKGROUND ART

In the related art, an electronic device with an electronic element mounted on an electronic element mounting substrate is known. As an electronic element mounting substrate used in such an electronic device, a substrate including a first wiring substrate, a metal plate bonded to a lower surface of the first wiring substrate, and an electronic element connection pad disposed on an upper surface of the first wiring substrate is exemplified. The electronic device is configured such that the electronic element is mounted on the electronic element mounting substrate and a cover or the like is disposed on the upper surface of the electronic element mounting substrate. In such an electronic device, the electronic element is mounted on a recessed portion formed by an upper surface of the metal plate and an inner surface of the first wiring substrate, and an external circuit or the like is electrically connected to an external circuit connection electrode which is disposed on an upper surface of the first wiring substrate, for example (see Japanese Unexamined Patent Publication JP-A 2006-303400).

In general, there is a difference in thermal expansion rates between the first wiring substrate formed of an insulating layer and the metal plate, and the thermal expansion rate of the metal plate is greater than that of the first wiring substrate. Therefore, if the metal plate is disposed on the lower surface of the first wiring substrate forming the electronic element mounting substrate and the electronic element is mounted on the upper surface of the metal plate, heat generated when the electronic element operates causes thermal stress between the first wiring substrate and the metal plate. There is a concern that the thermal stress concentrates on a bonding member which bonds the first wiring substrate to the metal plate and cracking or peeling-off occurs. Therefore, it has been considered to reduce the bonding area between the metal plate and the first wiring substrate. Thus, an electronic element mounting substrate in which a peripheral portion of the metal plate is located inside a peripheral portion of the first wiring substrate in a top transparent view is known.

In general, force is applied in a direction from the upper surface toward the lower surface of the first wiring substrate in a process of mounting a component such as a lens case body, the cover, or an electronic component on the upper surface of the first wiring substrate or in a process of performing wire bonding on the upper surface of the first wiring substrate. However, in the case of the electronic element mounting substrate with the aforementioned configuration, there is no object to be supported but only a space corresponding to the thickness of the metal plate in a region where the first wiring substrate and the metal plate are not overlaid. Therefore, there has been a concern that bending stress starting from the peripheral portion of the metal plate occurs in the first wiring substrate and cracking, breakage, or the like occurs in the first wiring substrate due to the application of the force in the direction from the upper surface to the lower surface of the first wiring substrate. Also, there is a requirement for reducing the thickness of the first wiring substrate. The concern of the occurrence of cracking, breakage, or the like in the first wiring substrate has become more serious due to the decrease in thickness.

An object of the invention is to provide an electronic element mounting substrate capable of suppressing occurrence of cracking and breakage in the first wiring substrate which is overlaid with the peripheral portion of the metal plate in a top transparent view and capable of realizing the decrease in the entire thickness even if a second wiring substrate is connected, and an electronic device using the electronic element mounting substrate.

SUMMARY OF INVENTION

An electronic element mounting substrate according to an aspect of the invention includes a first wiring substrate configured to be a frame defining an interior portion as a first through-hole, the first wiring substrate including a lower surface including an external circuit connection electrode. The electronic element mounting substrate further includes a metal plate disposed on the lower surface of the first wiring substrate so as to cover an opening of the first through-hole, an outer edge thereof being located between an outer edge of the first wiring substrate and an inner edge of the first wiring substrate, an electronic element mounting portion being disposed in a region of an upper surface of the metal plate which region is surrounded by the first wiring substrate. Furthermore, the electronic element mounting substrate includes a second wiring substrate which is disposed in a peripheral region of the metal plate on the lower surface of the first wiring substrate and is electrically connected to the external circuit connection electrode.

An electronic device according to an aspect of the invention includes the electronic element mounting substrate as described above and an electronic element that is mounted on the electronic element mounting portion of the metal plate.

DESCRIPTION OF EMBODIMENTS

Hereinafter, description will be given of some illustrative embodiments of the invention with reference to drawings. In the following description, it is assumed that an electronic device has a configuration in which an electronic element is mounted on an electronic element mounting substrate and a cover is bonded to an upper surface of the electronic element mounting substrate. Although any sides of the electronic element mounting substrate and the electronic device may be regarded as upper sides or lower sides, an orthogonal coordinate system xyz will be defined for convenience, and terms of an upper surface and a lower surface will be used on the assumption that the positive side in a z direction is an upper side.

First Embodiment

Figure 1:
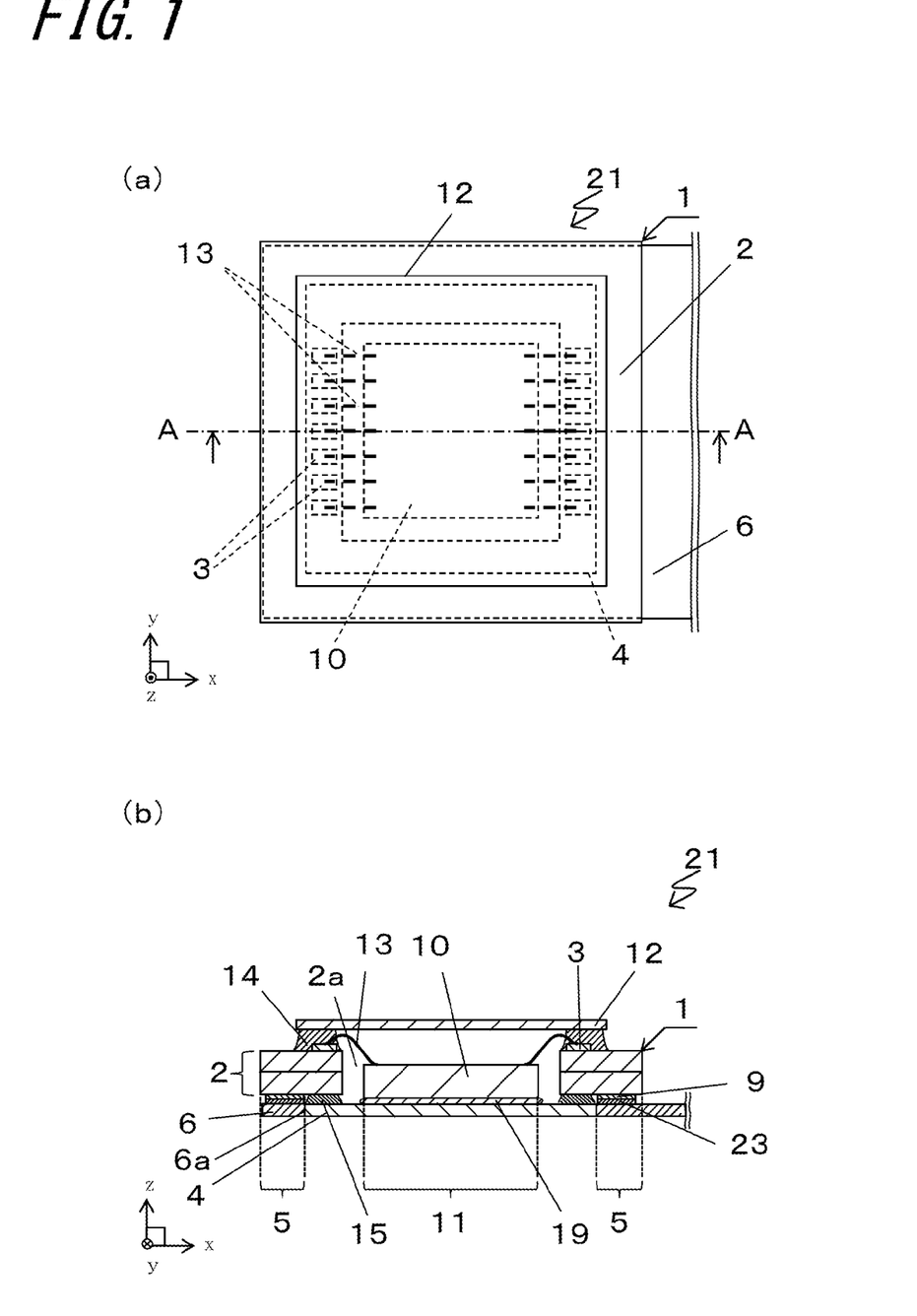
FIG. 1(a) is a top view illustrating appearances of an electronic element mounting substrate and an electronic device according to a first embodiment of the invention.
FIG. 1(b) is a longitudinal sectional view corresponding to the line A-A in FIG. 1(a)
Figure 2:
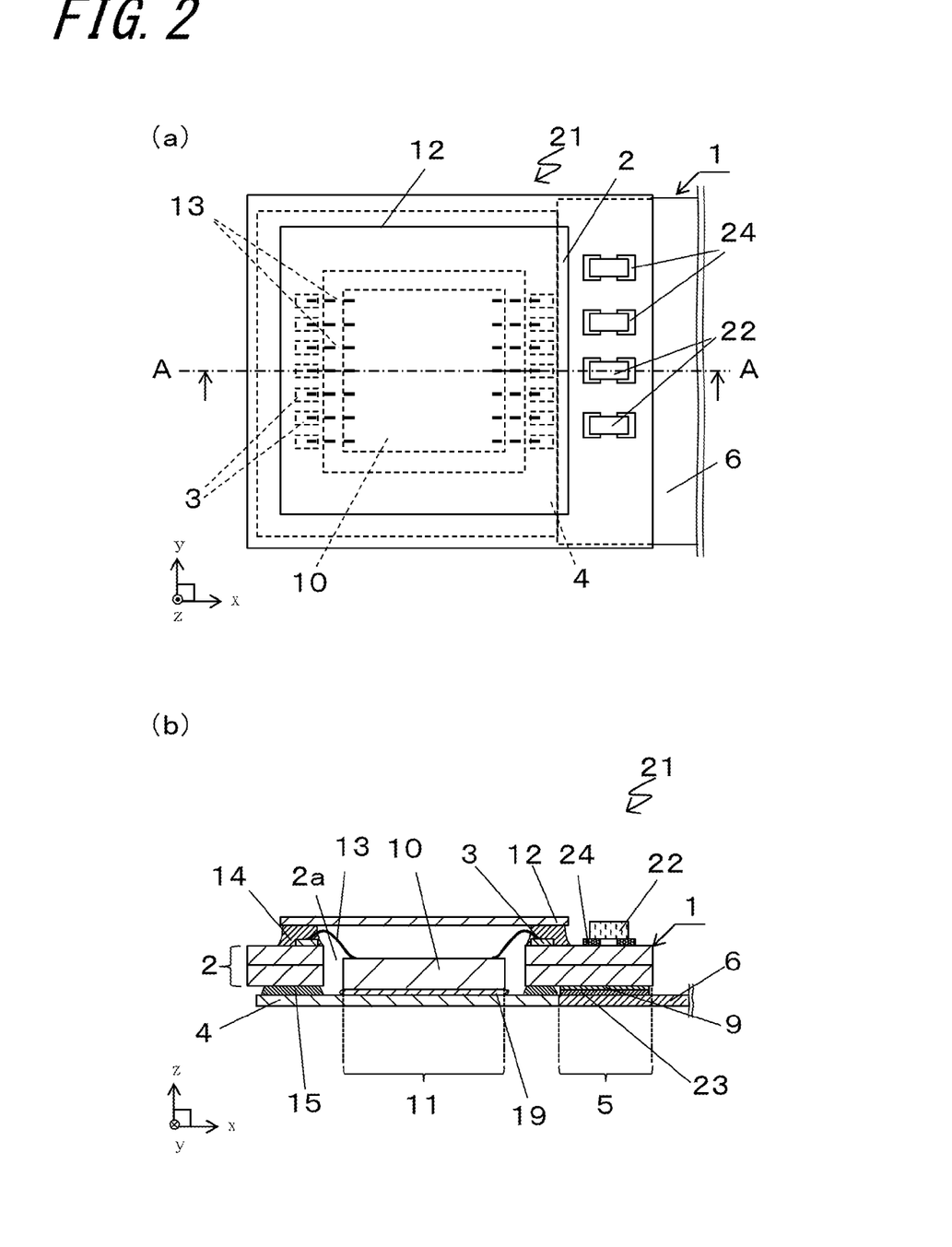
FIG. 2(a) is a top view illustrating appearances of the electronic element mounting substrate and the electronic device according to another aspect of the first embodiment of the invention.
FIG. 2(b) is a longitudinal sectional view corresponding to the line A-A in FIG. 1(a)
Figure 3:
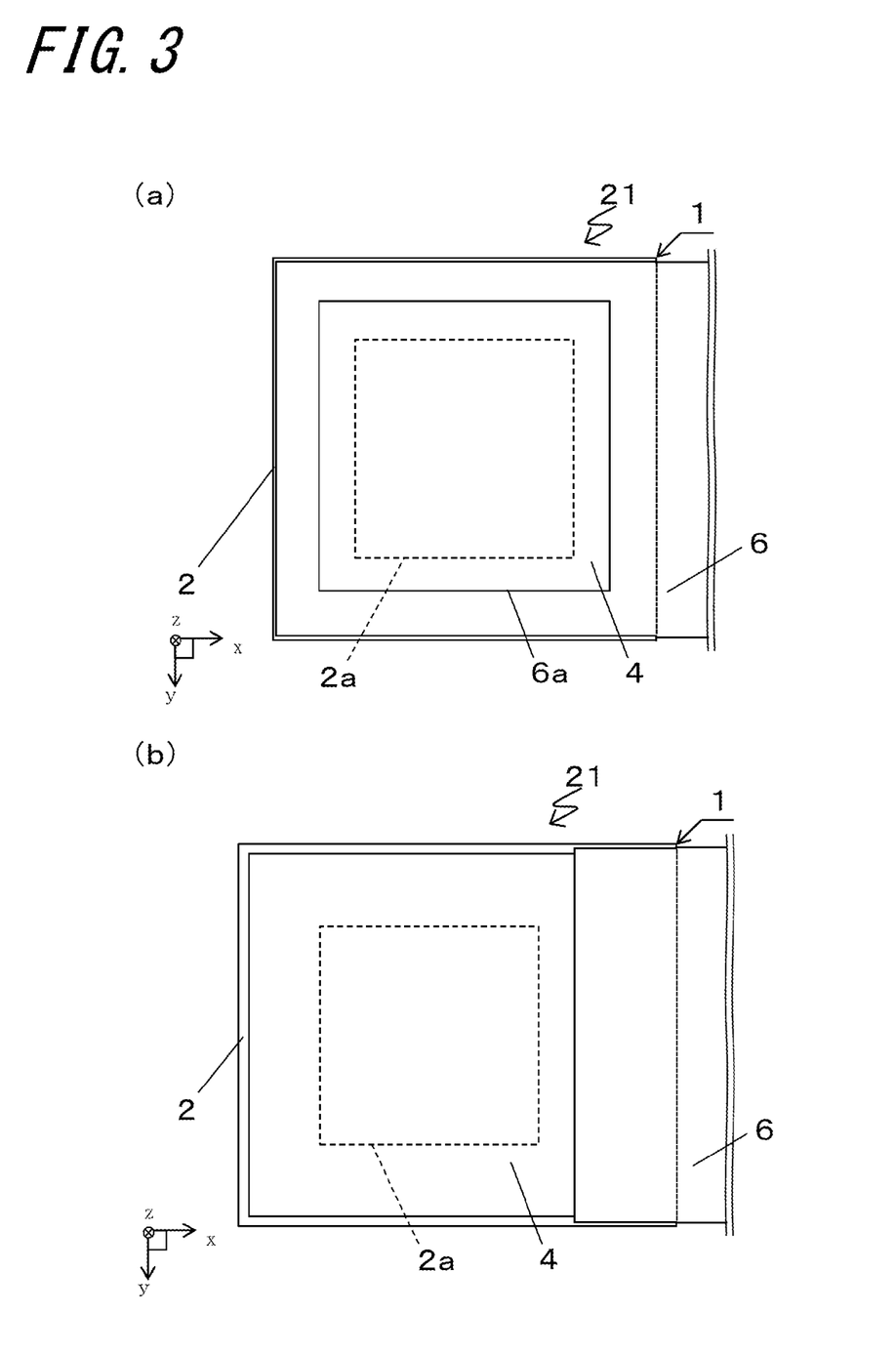
FIG. 3(a) is a bottom view of the electronic element mounting substrate according to the first embodiment illustrated in FIG. 1.
FIG. 3(b) is a bottom view of the electronic element mounting substrate according to another aspect of the first embodiment illustrated in FIG. 2.

Referring to FIGS. 1 to 3, description will be given of an electronic device 21 and an electronic element mounting substrate 1 according to a first embodiment of the invention. The electronic device 21 according to the embodiment includes the electronic element mounting substrate 1 and an electronic element 10.

In the example illustrated in FIGS. 1 to 3, the electronic element mounting substrate 1 includes a first wiring substrate 2 configured to be a frame defining an interior portion as a first through-hole 2a, the first wiring substrate 2 including a lower surface including with an external circuit connection electrode 9, a metal plate 4 disposed on the lower surface of the first wiring substrate 2 so as to cover an opening of the first through-hole 2a, an outer edge thereof being located between an outer edge of the first wiring substrate 2 and an inner edge of the first wiring substrate 2, an electronic element mounting portion 11 being disposed in a region of an upper surface of the metal plate 4 which region is surrounded by the first wiring substrate 2, and a second wiring substrate 6 which is disposed in a peripheral region 5 of the metal plate 4 on the lower surface of the first wiring substrate 2 and is electrically connected to the external circuit connection electrode 9.

In the example illustrated in FIGS. 1 to 3, the first wiring substrate 2 includes the first through-hole 2a and the external circuit connection electrode 9 which is disposed on the lower surface. As in the example illustrated in FIGS. 1 and 2, an electronic element connection pad 3 is disposed on the upper surface of the first wiring substrate 2. The external circuit connection electrode 9 is disposed on the lower surface of the first wiring substrate 2.

The first wiring substrate 2 is configured such that a wiring conductor, which will be described later, is formed on an insulating substrate. As a material of the insulating substrate, electrically insulating ceramics or resin, for example, is used.

Examples of the electrically insulating ceramics used as the material of the insulating substrate of the first wiring substrate 2 include an aluminum oxide sintered body, a mullite sintered body, a silicon carbide sintered body, an aluminum nitride sintered body, a silicon nitride sintered body, and a glass ceramic sintered body.

Examples of the resin used as the material of the insulating substrate of the first wiring substrate 2 includes epoxy resin, polyimide resin, acrylic resin, phenol resin and fluorine resin. Examples of the fluorine resin include polyester resin and tetrafluoroethylene resin.

As in the example illustrated in FIGS. 1 and 2, the first wiring substrate 2 is formed by respectively laminating a plurality of insulating layers made of the aforementioned material in the vertical direction.

The first wiring substrate 2 may be formed of two insulating layers as in the example illustrated in FIGS. 1 and 2 or may be formed of a single insulating layer or three or more insulating layers. In the example illustrated in FIGS. 1 and 2, the first wiring substrate 2 is formed of two insulating layers.

A wiring conductor formed of a penetration conductor for conduction between the insulating layers and internal wiring may be disposed in the first wiring substrate 2, or the first wiring substrate 2 may include a wiring conductor which is exposed to the surface. The external circuit connection electrode 9 and the electronic element connection pad 3 may be electrically connected by the wiring conductor. The respective wiring conductors disposed inside the respective frame bodies forming the first wiring substrate 2 may be electrically connected to each other by the wiring conductors exposed to the surfaces of the respective frame bodies.

Further, the external circuit connection electrode 9 may be disposed on the upper surface or the side surface of the first wiring substrate 2. The external circuit connection electrode 9 is provided for electrically connecting the electronic device 21 to a second wiring substrate 6 which will be described later, or an external device, for example.

The electronic element connection pad 3, the external circuit connection electrode 9, and the wiring conductors are made of tungsten (W), molybdenum (Mo), manganese (Mn), silver (Ag), copper (Cu), or an alloy containing at least one or more metal materials selected therefrom in a case where the first wiring substrate 2 is made of electrically insulating ceramics. The electronic element connection pad 3, the external circuit connection electrode 9, and the wiring conductors are made of copper (Cu), gold (Au), aluminum (Al), nickel (Ni), chromium (Cr), molybdenum (Mo), titanium (Ti), or an alloy containing at least one or more metal materials selected therefrom in a case where the first wiring substrate 2 is made of resin.

A plated layer is preferably disposed on the exposed surfaces of the electronic element connection pad 3, the external circuit connection electrode 9, and the wiring conductors. According to this configuration, it is possible to protect the exposed surfaces of the electronic element connection pad 3, the external circuit connection electrode 9, and the wiring conductors and to prevent oxidation. Also, according to this configuration, it is possible to establish a satisfactory electrical connection between the electronic element connection pad 3 and the electronic element 10 via wire bonding or a satisfactory electrical connection between the external circuit connection electrode 9 and an electrode disposed on the surface of the second wiring substrate 6. As the plated layer, an Ni plated layer with a thickness from 0.5 to 10 µm is adhered thereto. Alternatively, a gold (Au) plated layer with a thickness from 0.5 to 3 µm may be adhered to the Ni plated layer.

In the example illustrated in FIGS. 1 to 3, the metal plate 4 is disposed on the lower surface of the first wiring substrate so as to cover an opening of the first through-hole 2a and includes an electronic element mounting portion 11 at the center of the upper surface.

In the example illustrated in FIGS. 1 to 3, the electronic element 10 is mounted on the electronic element mounting portion 11, and the electronic element 10 is accommodated in a recessed portion formed by an inner surface of the first through-hole 2a of the first wiring substrate 2 and the upper surface of the metal plate 4.

In the example illustrated in FIGS. 1 to 3, an outer peripheral edge of the metal plate 4 is located further inner side beyond an outer peripheral edge of the first wiring substrate 2 in a plan view. This enables the bonding area between the metal plate 4 and the first wiring substrate 2 to be reduced. Therefore, it is possible to reduce stress applied between the first wiring substrate 2 and the metal plate 4 in a case where the electronic element 10 generates heat and a difference in thermal expansion occurs between the metal plate 4 and the first wiring substrate 2.

In the example illustrated in FIGS. 1 and 2, an outer periphery of the upper surface of the metal plate 4 is bonded to the lower surface of the first wiring substrate 2 by a bonding material 15 made of a brazing filler material, thermosetting resin, or low-melting-point glass. As the thermosetting resin, bisphenol A-type liquid epoxy resin is used, for example. It is preferable to use the bonding material 15 which is not denatured due to heat generated when the electronic element 10 is mounted or is operated since it is possible to satisfactorily suppress peeling-off between the first wiring substrate 2 and the metal plate 4 when the electronic element 10 is mounted or is operated. The bonding material 15 is preferably successively provided in a ring shape. In doing so, it is possible to more satisfactorily maintain air tightness in a region surrounded by the metal plate 4, the first wiring substrate 2, and the cover since the bonding material 15 is provided over the entire periphery of the metal plate 4.

As in the example illustrated in FIGS. 1 to 3, the second wiring substrate 6 is disposed on the lower surface of the first wiring substrate 2 in a peripheral region of the metal plate 4 and is connected to the external circuit connection electrode 9.

The peripheral region 5 may be interpreted as a region where the metal plate 4 is not formed on the lower surface of the first wiring substrate 2.

By providing the second wiring substrate 6 in the peripheral region 5, the lower surface of the first wiring substrate 2 is supported by the second wiring substrate even in a case where force is applied to the upper surface of the first wiring substrate 2. Therefore, it becomes possible to suppress generation of bending stress starting from the peripheral edge of the metal plate 4 in the first wiring substrate 2 and to thereby reduce occurrence of cracking, breakage, or the like in the first wiring substrate 2.

In order to alleviate the bending stress, it is considered that the first wiring substrate is provided with a protrusion protruding from a lower surface thereof toward a region which is not overlaid with the metal plate in a top transparent view.

Since the second wiring substrate for extracting a signal is connected to the upper surface of the first wiring substrate in a typical electronic element mounting substrate, it is difficult to realize a decrease in thickness of the electronic element mounting substrate.

Since the protrusion is not provided and the second wiring substrate 6 is provided in the peripheral region 5 in the invention, it is possible to accommodate the second wiring substrate 6, which was supposed to be disposed on the upper surface of the first wiring substrate, in a space for the protrusion. Therefore, it is possible to reduce the entire thickness of the electronic element mounting substrate 1.

The second wiring substrate 6 is configured such that a wiring conductor, which will be described later, is formed on an insulating substrate. As a material of the insulating substrate, electrically insulating ceramics, resin, or the like is used.

Examples of the electrically insulating ceramics used as the material of the insulating substrate of the second wiring substrate 6 include an aluminum oxide sintered body, a mullite sintered body, a silicon carbide sintered body, an aluminum nitride sintered body, a silicon nitride sintered body, and a glass ceramic sintered body.

Examples of the resin used as the material of the insulating substrate of the second wiring substrate 6 include epoxy resin, polyimide resin, acrylic resin, phenol resin, and fluorine resin. Examples of the fluorine resin include polyester resin and tetrafluoroethylene resin.

Resin is preferably used as the material of the second wiring substrate 6. By using the second wiring substrate 6 made of a material with low elasticity, such as resin, it is possible to reduce occurrence of chipping-off, for example, of the peripheral edge of the second wiring substrate 6 in a case where force is applied from the upper surface toward the lower surface of the first wiring substrate 2 in a process of wire bonding, for example.

As in the example illustrated in FIGS. 1 to 3, the peripheral edge of the second wiring substrate 6 (on the negative side in the x direction) is located on the further inner side beyond the peripheral edge of the first wiring substrate 2. In doing so, it is possible to set an external dimension of the electronic device 21 to be the dimension of the first wiring substrate 2 even if misalignment occurs in a process of bonding the first wiring substrate 2 and the second wiring substrate 6. Therefore, it is possible to constantly keep a mounting area where the electronic device 21 is mounted on the external device or the like. At this time, it is possible to further enhance the aforementioned effect if the distance from the peripheral edge of the first wiring substrate 2 to the peripheral edge of the second wiring substrate 6 is from about 20 µm to about 200 µm.

The peripheral edge (on the negative side in the x direction) of the second wiring substrate 6 may be located at a further outer side beyond the peripheral edge of the first wiring substrate 2. In such a case, it is possible to reduce occurrence of cracking or breakage in the peripheral edge of the first wiring substrate 2 since the peripheral edge of the second wiring substrate 6 is brought into contact with the external object first even if unexpected inclination occurs in the electronic element mounting substrate (during handling, for example). It is possible to more reliably achieve the aforementioned effect by locating the peripheral edge of the second wiring substrate 6 outside the peripheral edge of the first wiring substrate 2 by a distance of equal to or greater than 20 µm.

The second wiring substrate 6 may be located on a further outer side beyond the peripheral edge of the first wiring substrate 2 and may be bonded to another circuit, another component, or the like.

By setting the thickness of the second wiring substrate 6 in the vertical direction to be equal to the thickness of the metal plate 4 in the vertical direction, it is possible to reduce the inclination of the electronic element mounting substrate 1 in a process of fixing the electronic element 10 to the metal plate 4, for example. Also, it is possible to facilitate the bonding between the electronic element 10 and the electronic element connection pad 3 in the process of bonding the electronic element 10 and the electronic element connection pad 3. Moreover, it is possible to suppress an application of bending stress starting from the peripheral edge of the metal plate 4 to the first wiring substrate 2.

As in the example illustrated in FIG. 3(*b*), the second wiring substrate 6 may be disposed at a part of the peripheral region 5 of the metal plate 4. The second wiring substrate 6 is preferably disposed at a portion with a large width in the peripheral region 5. In doing so, it is possible to efficiently support the first wiring substrate 2 at a portion where the first wiring substrate 2 is most easily deformed. Therefore, it becomes possible to further suppress the application of bending stress starting from the peripheral edge of the metal plate 4 to the portion where the first wiring substrate 2 is most easily deformed and to thereby reduce occurrence of cracking or breakage in the first wiring substrate.

As in the example illustrated in FIG. 3(*a*), the second wiring substrate 6 is preferably configured to be a frame defining an interior portion as a second through-hole 6*a* which is greater than the first through-hole 2*a* of the first wiring substrate 2. With such a configuration, the entire periphery of the outer edge of the metal plate 4 is surrounded by the second wiring substrate 6. Therefore, it is possible to support the first wiring substrate 2 by the second wiring substrate 6 at the entire periphery of the outer edge of the first wiring substrate 2. Accordingly, it becomes possible to suppress an application of bending stress starting from the peripheral edge of the metal plate 4 to the entire periphery of the outer edge of the first wiring substrate 2 and to thereby reduce occurrence of cracking or breakage in the first wiring substrate 2.

In the example illustrated in FIGS. 1 to 3, the first wiring substrate 2 and the second wiring substrate 6 are connected via an external circuit connection member 23, the first wiring substrate 2 and the metal plate 4 are connected via the bonding material 15, and the total thickness of the second wiring substrate 6 and the external circuit connection member 23 in the vertical direction is equal to the total thickness of the metal plate 4 and the bonding material 15 in the vertical direction. In doing so, it is possible to reduce the inclination of the electronic element mounting substrate 1 when the electronic element is mounted, for example, and to thereby easily mount the electronic element 10. At this time, it is sufficient that design values of the thicknesses of the metal plate 4 and the bonding material 15 are equal to each other, and errors at the time of fabrication may be included in an actual product.

Next, description will be given of the electronic device 21 with reference to FIGS. 1 to 3. In the example illustrated in FIG. 1, the electronic device 21 includes the electronic element mounting substrate 1 and the electronic element 10 mounted on the electronic element mounting portion 11 of the metal plate 4. In the example illustrated in FIGS. 1 to 3, the electronic device 21 includes the cover 12 bonded to the upper surface of the electronic element mounting substrate 1.

As the electronic element 10, an imaging element of a CCD-type, a CMOS-type, or the like or a light emitting element such as an LED is used, for example. In the example illustrated in FIGS. 1 and 2, the respective electrodes of the electronic element 10 are electrically connected to the electronic element connection pad 3 by a connection member 13 (bonding wire). The electronic element 10 may be adhered to the metal plate 4 by an adhesive 19 such as silver epoxy or thermosetting resin, for example.

The cover 12 is a plate-shaped optical filter, for example. For the cover 12, a member having high transparency such as a glass material or an optical filter may be used in a case where the electronic element 10 is an imaging element or a light emitting element, for example. The cover 12 may be a plate made of a metal material in a case where the electronic element 10 is a memory or an arithmetic element such as an ASIC, for example. The cover 12 is bonded to the upper surface of the frame body 2 by a bonding member 14 such as thermosetting resin or low-melting-point glass, for example.

As in the example illustrated in FIG. 2, an electronic component 22 such as a capacitor may be mounted on the upper surface of the first wiring substrate 2. In the case where the electronic component 22 is mounted on the upper surface of the first wiring substrate 2, the second wiring substrate 6 is preferably disposed at such a position that the second wiring substrate 6 is overlaid with a connection terminal 24 of the electronic component 22 in a top transparent view. In doing so, it is possible to support the lower surface of the first wiring substrate 2 by the second wiring substrate 6 even in a case where force is applied to the upper surface of the first wiring substrate 2 in a process of mounting the electronic component 22. Therefore, it becomes possible to suppress the application of bending stress starting from the peripheral edge of the metal plate to the first wiring substrate. The electronic component 22 may be disposed on the side surface or the lower surface of the first wiring substrate 2.

Since the electronic device 21 according to the invention includes the electronic element mounting substrate 1 with the aforementioned configuration, the electronic element 10 mounted on the electronic element mounting portion 11 of the metal plate 4, and the cover 12 bonded to the upper surface of the frame body 2 of the electronic element mounting substrate 1, the electronic device 21 can reduce occurrence of cracking or breakage in the first wiring substrate 2, and it is possible to provide the electronic device 21 capable of being reduced in thickness.

Next, description will be given of an example of a method of manufacturing the electronic element mounting substrate 1 according to the embodiment.

The example of the manufacturing method described below is a manufacturing method using a segmentable wiring substrate.

(1) First, a ceramic green sheet constituting the first wiring substrate 2 is formed. In a case of obtaining the first wiring substrate 2 made of an aluminum oxide ($Al_2O_3$) sintered body, for example, powder of silica ($SiO_2$), magnesia ($MgO$), or calcia ($CaO$) as a sintering aid is added to $Al_2O_3$ powder, an appropriate binder, a solvent, and a plasticizer are further added thereto, and a mixture thereof is then kneaded into a slurry form. Thereafter, a segmentable ceramic green sheet is obtained by a molding method such as a doctor blade method or a calendar roll method that is known in the related art.

In a case where the first wiring substrate 2 is made of resin, for example, it is possible to form the first wiring substrate 2 by using a mold capable of molding the resin into a predetermined shape to perform the molding by a transfer molding method or an injection molding method.

The first wiring substrate 2 may be made by impregnating a base material made of glass fiber with resin, as in glass epoxy resin. In such a case, it is possible to form the first wiring substrate 2 by impregnating the base material made of glass fiber with a precursor of epoxy resin and thermally curing the epoxy resin precursor at a predetermined temperature.

(2) Next, portions, which will become the electronic element connection pad 3, the external circuit connection electrode 9, and the wiring conductors, of the ceramic green sheet obtained in the above process (1) is coated or filled with a metal paste by a method such as a screen printing method. By firing the metal paste at the same time with the ceramic green sheet that will become the first wiring substrate 2, the electronic element connection pad 3, the external circuit connection electrode 9, the wiring conductors, and the like are formed.

The metal paste is produced to have appropriately adjusted viscosity by adding an appropriate solvent and a binder to metal powder made of the aforementioned metal material and kneading the mixture. The metal paste may contain glass or ceramics in order to enhance bonding strength with the first wiring substrate 2.

(3) Next, the aforementioned green sheet is processed with a mold or the like. The first through-hole is formed at the center of the green sheet which will become the first wiring substrate 2.

(4) Next, a ceramic green sheet laminated body which will become the first wiring substrate 2 is produced by laminating and pressurizing ceramic green sheets which will become the respective insulating layers. In the process, the green sheet laminated body which will become the first wiring substrate 2 may be produced by individually producing green sheet laminated bodies which will become the respective layers in the first wiring substrate 2 and then laminating and pressuring the plurality of green sheet laminated bodies, for example.

(5) Next, the ceramic green sheet laminated body is fired at a temperature from about 1500 to 1800° C. to obtain a segmentable wiring substrate in which a plurality of first wiring substrates 2 are aligned. By this process, the aforementioned metal paste becomes the electronic element connection pad 3, the external circuit connection electrode 9, or the wring conductors.

(6) Next, the segmentable wiring substrate obtained by the firing is divided into the plurality of first wiring substrates 2. For the division, a method of forming splitting grooves in advance in the segmentable wiring substrate along portions that will become external edges of the first wiring substrates 2 and causing the segmentable wiring substrate to fracture along the splitting grooves or a method of cutting the segmentable wiring substrate along portions, which will become the external edges of the first wiring substrates 2, by a slicing method or otherwise can be used. Although the splitting groove can be formed by cutting the segmentable wiring substrate by a length shorter than the thickness of the segmentable wiring substrate after the firing by using a slicing device, the splitting groove may be formed by pressing a cutter blade onto the ceramic green sheet laminated body for the segmentable wiring substrate or cutting the ceramic green sheet laminated body by a length shorter than the thickness of the ceramic green sheet laminated body by a slicing device.

(7) Next, the metal plate 4 to be bonded to the lower surface of the first wiring substrate 2 is prepared. The metal plate 4 is produced by performing punching processing using a stamping mold or etching processing that is known in the related art on a plate material made of metal. Thereafter, the surface of the metal plate 4 may be coated with a nickel plated layer and a gold plated layer in a case where the metal plate 4 is made of a metal such as an Fe—Ni—Co alloy, a 42 alloy, Cu, or a copper alloy. In doing so, it is possible to effectively prevent oxidation corrosion from occurring on the surface of the metal plate 4.

The aforementioned punching processing, etching processing, or the like may be used even in a case where the second through hole is provided in the metal plate 4.

(8) Next, the metal plate 4 is bonded to the first wiring substrate 2 via the bonding material 15. In this process, the bonding material 15 is completely thermally cured and the first wiring substrate 2 and the metal plate 4 are fixedly adhered to each other by applying thermosetting resin (adhesive member) in a paste form to any one of bonding surfaces of the frame body 2 and the metal plate 4 by a screen printing method, a dispensing method, or otherwise, drying the thermosetting resin in a tunnel-type atmospheric furnace, an oven, or the like, then causing the first wiring substrate 2 and the metal plate 4 in the overlaid state to pass through the tunnel-type atmospheric furnace, the oven, or the like to heat the first wiring substrate 2 and the metal plate 4 at about 150° C. for about 90 minutes.

The bonding material 15 is obtained by adding a filler made of spherical silicon oxide or the like, a curing agent containing acid anhydride such as tetrahydromethylphtalic anhydride as a main constituent, and carbon powder, for example, as a coloring agent to a base compound made of bisphenol A liquid epoxy resin, bisphenol F liquid epoxy resin, or phenolic novolak liquid resin, for example, mixing and kneading the materials into a paste form by using a centrifugal stirrer.

In another example, it is possible to use the bonding material 15 obtained by adding an imidazole-based, an amine-based, a phosphorous-based, hydrazine-based, an imidazole-adduct-based, an amine-adduct-based, a cationic-polymerization-based, or a dicyandiamide-based curing agent to epoxy resin such as bisphenol A-type epoxy resin, bisphenol A-modified epoxy resin, bisphenol F-type epoxy resin, phenolic novolak-type epoxy resin, cresol novolak-type epoxy resin, special novolak-type epoxy resin, phenol derivative epoxy resin, or bisphenol skeleton-type epoxy resin.

For the bonding material 15, low-melting-point glass may be used instead of the resin. For example, low-melting-point glass obtained by adding 4 to 15% by mass of zirconia oxide-silica-based compound as a filler to a glass component containing 56 to 66% by mass of lead oxide, 4 to 14% by mass of boron oxide, 1 to 6% by mass of silicon oxide, and 1 to 11% by mass of zinc oxide is used. A glass paste is obtained by adding an appropriate organic solvent and a medium to glass powder with these compositions and mixing the materials. The adhesive member is fixedly attached to the aforementioned surface of the frame body 2 or the metal plate 4 by applying the glass paste to any one of the bonding surfaces of the first wiring substrate 2 and the metal plate 4 by a screen printing method known in the related art and firing the glass paste at a temperature of about 430° C. Thereafter, the metal plate 4 and the first wiring substrate 2 in the overlaid state are passed through a tunnel-type atmospheric furnace, an oven, or the like and are heated at about 470° C., thereby melting and attaching the adhesive member and fixedly bonding the first wiring substrate 2 and the metal plate 4.

(9) Next, the second wiring substrate 6 is prepared. The second wiring substrate 6 is made of electrically insulating ceramics or resin, for example. As a manufacturing method, the second wiring substrate 6 can be produced by the same method for the first wiring substrate 2 described in (1) to (6). In a case where the second wiring substrate 6 is a flexible wiring substrate, it is possible to produce the second wiring substrate 6 by performing a process of forming a photoresist layer on a substrate made of polyimide and a process of causing a polyimide cover film to adhere to an upper surface of a circuit pattern formed on the substrate by a DES (Development Etching Stripping) process, for example.

(10) Next, the external circuit connection electrode 9 and the second wiring substrate 6 disposed on the lower surface of the first wiring substrate 2 are bonded via the external circuit connection member 23. As for a material of the external circuit connection member 23, the external circuit connection member 23 may be made of a metal material such as solder or may be made of resin such as an anisotropic conductive film.

In the case where the external circuit connection member 23 is made of solder, electric conduction can be established by applying cream solder or the like to the second wiring substrate 6 and bonding the second wiring substrate 6 by reflowing while fixing the first wiring substrate 2 at a predetermined position and applying a pressure thereto.

In the case where the external circuit connection member 23 is made of an anisotropic conductive resin, for example, electric conduction can be establish by applying the external circuit connection member 23 made of the anisotropic conductive resin to a predetermined position of the first wiring substrate 2 or the second wiring substrate 6, pressurizing, and heating, thereby bonding the first wiring substrate 2 and the second wiring substrate 6.

At this time, the first wiring substrate 2 and the second wiring substrate 6 may be further bonded by the bonding material 15 that bonds the metal plate 4 and the first wiring substrate 2. By bonding the first wiring substrate 2 and the second wiring substrate 6 as described above, it is possible to produce the electronic element mounting substrate 1.

The electronic element mounting substrate 1 can be obtained by the aforementioned processes (1) to (10). The order of the processes (1) to (10) may be rearranged.

The electronic device 21 can be produced by mounting the electronic element 10 on the electronic element mounting portion of the electronic element mounting substrate 1 formed as described above.

Second Embodiment

Next, description will be given of an electronic element mounting substrate 1 and an electronic device 21 according to a second embodiment of the invention with reference to FIG. 4. A cover 12 is omitted from the electronic device 21 illustrated in FIG. 4.

The electronic device 21 according to the embodiment is different from the electronic device 21 according to the first embodiment in that a clearance 7 is provided between the side surface of the metal plate 4 and the side surface of the second wiring substrate 6 on the side of the metal plate 4 and the first wiring substrate 2 includes a stepped portion in a top transparent view.

Figure 4:
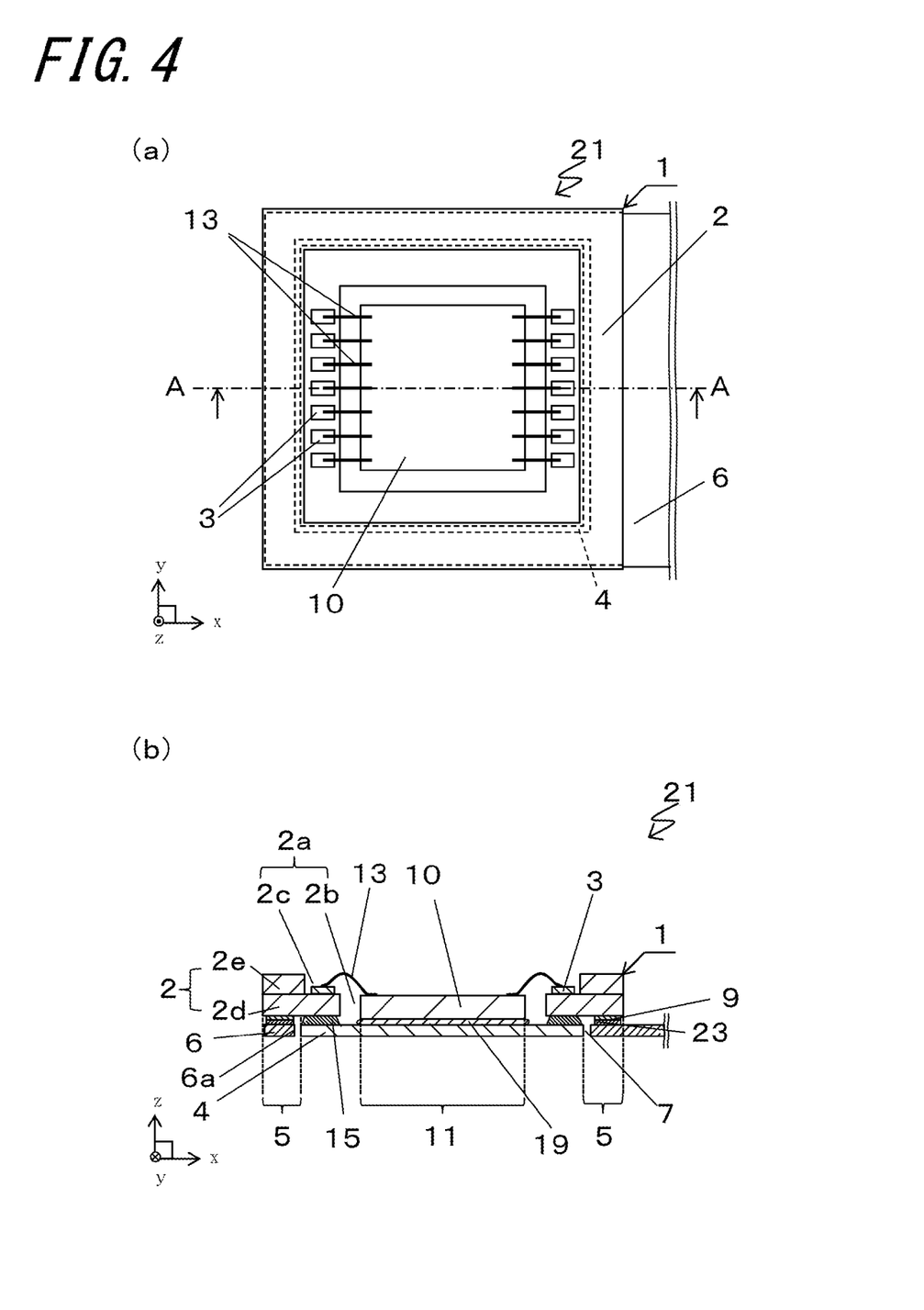
FIG. 4(a) is a top view illustrating appearances of an electronic element mounting substrate and an electronic device according to a second embodiment of the invention.
FIG. 4(b) is a longitudinal sectional view corresponding to the line A-A in FIG. 4(a)

By providing the clearance 7 between the metal plate 4 and the second wiring substrate 6 as in the example illustrated in FIG. 4, it is possible to suppress a contact between the second wiring substrate 6 and the metal plate 4 when the second wiring substrate 6 is bonded to the first wiring substrate 2 and to thereby suppress occurrence of cracking or breakage in the metal plate 4 or the second wiring substrate 6. Therefore, it is possible to reduce dust or the like generated from the metal plate 4 or the second wiring substrate 6 entering the space where the electronic element 10 is sealed. Also, it is possible to reduce the bonding between the second wiring substrate 6 and the metal plate 4 while one of the second wiring substrate 6 and the metal plate 4 is overlaid with the other. Therefore, it is possible to reduce occurrence of inclination of the electronic element mounting substrate 1 starting from a portion where the second wiring substrate 6 and the metal plate 4 are overlaid and to thereby reduce generation of bending stress.

In the example illustrated in FIG. 4, the first wiring substrate 2 includes a second frame body 2e which is disposed on an upper surface of a first frame body 2d with a third through-hole 2b and includes a fourth through-hole 2c which is greater than the third through-hole 2b, and the clearance 7 is provided at such a position that the clearance 7 is overlaid with the second frame body 2e in a top transparent view. With such a configuration, it is possible to provide the clearance 7 at such a position that the clearance 7 is overlaid with the thickest portion of the first wiring substrate 2 in a top transparent view. Therefore, it is possible to suppress the first wiring substrate 2 from bending due to an application of such stress that causes the first wiring substrate 2 to enter the clearance 7 in a case where force is applied from the upper surface of the first wiring substrate 2 in a process of wire bonding or a process of mounting a lens case body 31. Therefore, the first wiring substrate is not easily deformed, and it is possible to reduce occurrence of cracking or breakage in the first wiring substrate 2.

As in the example illustrated in FIG. 4, it is preferable that the clearance 7 is provided at such a position that the clearance 7 is overlaid with the second frame body 2e in a top transparent view and the clearance is provided at such a position that the clearance 7 is not overlaid with the position of the inner wall of the second frame body 2e in a top transparent view. When the lens case body 31, the cover 12, the electronic component 22, and the like are bonded to the first wiring substrate 2, force is applied to the upper surface of the second frame body 2e. A point where bending stress starts due to the force is an end of the metal plate 4 or the second through-hole 6a (second wiring substrate 6). According to the aforementioned configuration, the end of the metal plate 4 or the second through-hole 6a (second wiring substrate 6) is located immediately below the second frame body 2e and is overlaid with the second frame body 2e. Here, the thickness of the first wiring substrate 2 is thick in a region where the second frame body 2e is laminated on the first frame body 2d. Therefore, since bending stress applied from the end of the metal plate 4 or the second through-hole 6a (second wiring substrate 6) does not easily act on the first wiring substrate 2 with the sufficient thickness, occurrence of cracking, breakage, or the like is reduced.

If it is assumed that the width of the clearance 7 is x1 and the width between the inner surface and the outer surface of the first wiring substrate 2 is w1, x1 is preferably about 0.1% to 25% of w1. If the x1 is within the numerical value range, it is possible to reduce the force acting such that the first wiring substrate 2 is bent and enters the clearance 7 even in a case where the force is applied to the first wiring substrate 2 from the upper surface. Therefore, it is possible to suppress the application of the bending stress starting from the peripheral edge of the metal plate 4 to the first wiring substrate 2 and to thereby reduce occurrence of cracking or breakage in the first wiring substrate 2.

It is preferable that the electronic element connection pad 3 is disposed on the upper surface of the first wiring substrate 2 and the electronic element connection pad 3 is located at such a position that the electronic element connection pad 3 is not overlaid with the clearance 7 in a top transparent view. With such a configuration, the metal plate 4 or the second wiring substrate 6 is disposed at such a position that the metal plate or the second wiring substrate 6 is overlaid with the electronic element connection pad 3 in a top transparent view. In doing so, it is possible to reduce the application of such force that the first wiring substrate 2 is bent and then enters the clearance 7 even in a case where force is applied to the upper surface of the first wiring substrate 2 when wiring bonding is performed on the electronic element connection pad 3.

As in the example illustrated in FIG. 4, the first through-hole 2a is formed of the third through-hole 2b and the fourth through-hole 2c. The first frame body 2d and the second frame body 2e may be formed of a single insulating layer as in the example illustrated in FIG. 4, or may be formed of two or more insulating layers, respectively.

A wiring conductor including internal wiring and a penetration conductor may be disposed inside the first wiring substrate 2 formed of the first frame body 2d and the second frame body 2e. The respective wiring conductors disposed inside the first frame body 2d and the second frame body 2e forming the first wiring substrate 2 may be electrically connected by the wiring conductors exposed from the surfaces of the first frame body 2d and the second frame body 2e.

In the example illustrated in FIG. 4, the stepped portion is formed by the inner side surface of the second frame body 2e and the upper surface of the first frame body 2d, and the electronic element connection pad 3 is disposed at the stepped portion. When the connection member 13 is formed of a bonding wire, it is possible to provide the top of the bonding wire at a low position by providing the electronic element connection pad 3 at the stepped portion. Therefore, it is possible to reduce contact between the bonding wire 13 and the cover 12 in a process of sealing the electronic element mounting substrate 1 with the cover 12 and the bonding member 14.

Third Embodiment

Next, description will be given of an electronic element mounting substrate 1 and an electronic device 21 according to a third embodiment of the invention with reference to FIG. 5. A cover 12 is omitted from the electronic device 21 illustrated in FIG. 5.

The electronic device 21 according to the embodiment is different from the electronic device 21 according to the second embodiment in that a clearance 7 between a metal plate 4 and a second wiring substrate 6 is filled with a bonding material 15.

Figure 5:
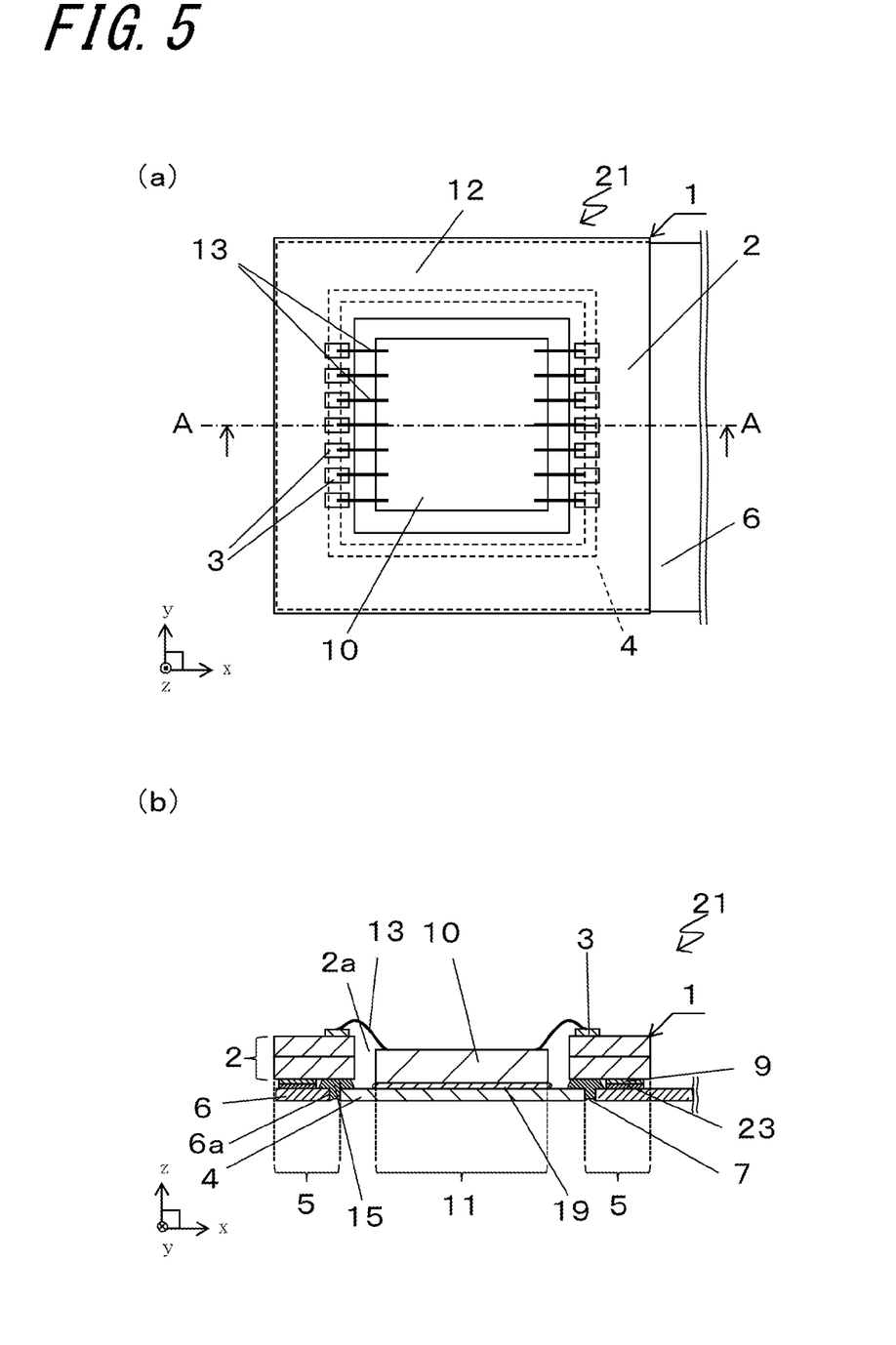
FIG. 5(a) is a top view illustrating appearances of an electronic element mounting substrate and an electronic device according to a third embodiment of the invention.
FIG. 5(b) is a longitudinal sectional view corresponding to the line A-A in FIG. 5(a)

In the example illustrated in FIG. 5, the clearance 7 between the metal plate 4 and the second wiring substrate 6 is filled with the bonding material 15. By filling the clearance 7 with the bonding material 15 or the like as described above, it is possible to reduce bending of the first wiring substrate 2 due to an application of such stress that the first wiring substrate 2 enters the clearance 7 even in a case where force is applied to the first wiring substrate 2 form the upper surface. Therefore, it becomes possible to suppress an application of bending stress starting from a peripheral edge of the metal plate 4 to the first wiring substrate 2 and to thereby reduce occurrence of cracking or breakage in the first wiring substrate 2.

By filling the clearance 7 with the bonding material 15, it is possible to suppress moisture, dust, and the like entering the clearance 7. In doing so, it becomes possible to prevent the external circuit connection member 23 bonding the first wiring substrate 2 and the second wiring substrate 6 or the bonding material 15 at a portion where the metal plate 4 and the first wiring substrate 2 are bonded from being degraded and to reduce peeling-off.

Although a substance with which the clearance 7 is filled is the bonding material 15 in the example illustrated in FIG. 5, the substance may be a part of the external circuit connection member 23 or another member, for example. It is preferable that the substance is insulating resin such as thermosetting resin, and if so, it is possible to easily prevent the external circuit connection electrode 9 and the metal plate 4 from being short-circuited.

As a method of filling the clearance 7 with the thermosetting resin or the like (bonding material 15), there is a method of applying the thermosetting resin to the clearance 7 of the electronic device 21 and hardening the thermosetting resin by reflowing, for example.

Fourth Embodiment

Next, description will be given of an electronic element mounting substrate 1 and an electronic module 30 according to a fourth embodiment of the invention with reference to FIG. 6.

The electronic module 30 according to the embodiment is different from the electronic device 21 according to the first embodiment in that a clearance 7 between a metal plate 4 and a second wiring substrate 6 is overlaid with a lens case body 31 in a top transparent view.

Figure 6:
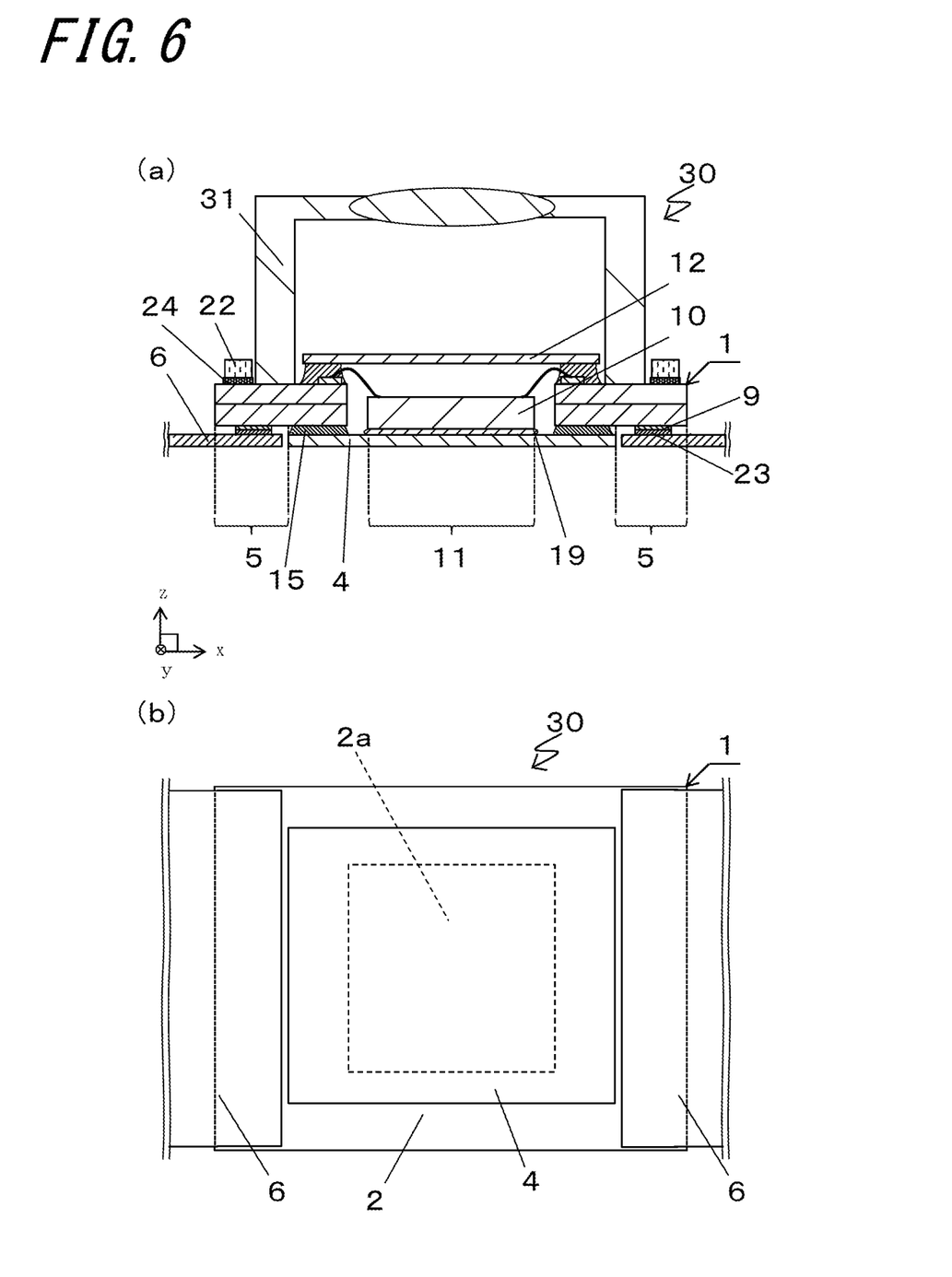
FIG. 6(a) is a top view illustrating appearances of an electronic element mounting substrate and an electronic module including an electronic device according to a fourth embodiment of the invention.
FIG. 6(b) is a bottom view of FIG. 6(a)

FIG. 6 illustrates an example of the electronic module 30 (imaging module) in which the lens case body 31 is bonded to an upper surface of an electronic device 21 on which an imaging element of a CMOS sensor or the like is mounted as an electronic element 10.

In the example illustrated in FIG. 6, the clearance 7 between the metal plate 4 and the second wiring substrate 6 is located so as to be overlaid with a side wall of the lens case body 31 in a top transparent view. In the example illustrated in FIG. 6, an electronic element connection pad 3 and an electronic component 22, for example, are mounted in a region where the side wall is not arranged on the upper surface of the first wiring substrate 2. At this time, it is possible to obtain arrangement in which the clearance 7 is not present immediately below the region where the electronic element connection pad 3 and the electronic component 22 are mounted according to the aforementioned configuration. Therefore, the first wiring substrate 2 is sufficiently supported by support of the second wiring substrate 6 or the metal plate 4 even if force is applied from the upper surface of the first wiring substrate 2 when the electronic component 22 is mounted or when wire bonding is performed on the electronic element connection pad 3. Therefore, bending stress is not easily applied to the first wiring substrate 2, and it becomes possible to reduce occurrence of cracking or breakage in the first wiring substrate 2.

If it is assumed that the width of the clearance 7 is x2 and the width of the side wall of the lens case body 31 is w2 at this time, x2 is preferably about 5 to 40% of w2. By setting x2 within this range, it is possible to reduce bending of the first wiring substrate 2 and entering of the first wiring substrate 2 into the clearance 7 even in a case where force is applied to the first wiring substrate 2 from the upper surface in a process of mounting the lens case body 31.

Therefore, it becomes possible to suppress an application of bending stress starting from a peripheral edge of the metal plate 4 to the first wiring substrate 2 and to thereby reduce occurrence of cracking or breakage in the first wiring substrate 2.

Fifth Embodiment

Next, description will be given of an electronic element mounting substrate 1 and an electronic device 21 according to a fifth embodiment of the invention with reference to FIG. 7.

The electronic device 21 according to the embodiment is different from the electronic device 21 according to the first embodiment in that the thickness of a second wiring substrate 6 in the vertical direction is greater than the thickness of a metal plate 4 in the vertical direction.

Figure 7:
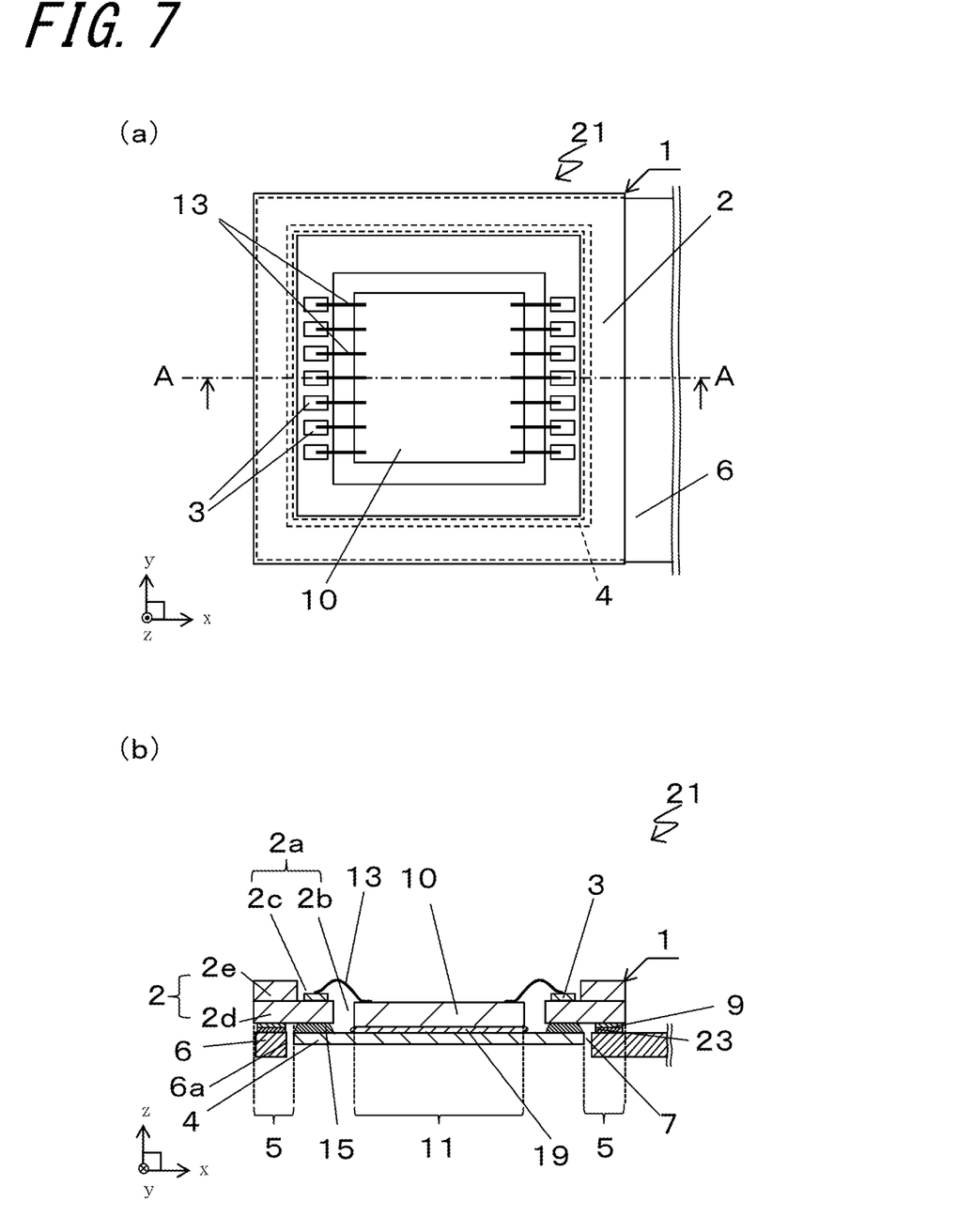
FIG. 7(a) is a top view illustrating appearances of an electronic element mounting substrate and an electronic device according to a fifth embodiment of the invention.
FIG. 7(b) is a longitudinal sectional view corresponding to the line A-A in FIG. 7(a).

In the example illustrated in FIG. 7, the thickness of the second wiring substrate 6 in the vertical direction is greater than the thickness of the metal plate 4 in the vertical direction. This enables contact between the metal plate 4 and a manufacturing apparatus or the like to be reduced in a process of mounting the electronic element 10, a process of providing a cover to the electronic device 21, a process of mounting a lens case body 31 or the like on the electronic device 21 in order to produce an electronic module 30, and the like. Therefore, it is possible to reduce deformation of the metal plate 4 due to contact with a stage of the manufacturing apparatus or pressurization from the upper direction in a state where the metal plate 4 is in contact with the stage and to thereby reduce inclination of the electronic element 10 in mounting the electronic element 10. Also, it is possible to reduce delivery of stress to the electronic element 10 due to an application of stress from a lower surface side to the metal plate 4 after the mounting of the electronic component 10 or deformation of the metal plate 4. This is particularly effective since there is a requirement for reducing the thickness of the metal plate 4 in a case where the electronic element 10 is an imaging device and the metal plate 4 has become easily deformed in recent years. It is possible to prevent unexpected short-circuiting due to contact with an external device in a case where the metal plate 4 and the electronic component 10 or the first wiring substrate 2 are bonded at a ground potential, for example.

The invention is not limited to the aforementioned exemplary embodiments, and various modifications are possible without departing from the scope of the invention.

Although the openings of the first through-hole 2a of the first wiring substrate 2 and the second through-hole 6a of the second wiring substrate 6 have rectangular shapes in the examples illustrated in FIGS. 1 to 6, for example, the openings may have circular shapes or other polygonal shapes.

Also, arrangement, the number, the shape, and the like of the electronic element connection pad 3 in the embodiments are not designated.

The invention claimed is:

1. An electronic element mounting substrate, comprising:
a first wiring substrate configured to be a frame defining an interior portion as a first through-hole, the first wiring substrate comprising a lower surface comprising an external circuit connection electrode;
a metal plate disposed on the lower surface of the first wiring substrate that covers an opening of the first through-hole, an outer edge thereof being located between an outer edge of the first wiring substrate and an inner edge of the first wiring substrate, an electronic element mounting portion being disposed in a region of an upper surface of the metal plate which region is surrounded by the first wiring substrate; and
a second wiring substrate which is disposed in a peripheral region of the metal plate on the lower surface of the first wiring substrate and is electrically connected to the external circuit connection electrode,
wherein a clearance is provided between a side surface of the metal plate and a side surface of the second wiring substrate on a metal plate side.

2. The electronic element mounting substrate according to claim 1,
wherein a thickness in a vertical direction of the second wiring substrate is equal to a thickness in a vertical direction of the metal plate.

3. The electronic element mounting substrate according to claim 1,
wherein the second wiring substrate is configured to be a frame defining an interior portion as a second through-hole which is greater than the first through-hole of the first wiring substrate.

4. The electronic element mounting substrate according to claim 1,
wherein the first wiring substrate comprises a first frame body defining an interior portion as a third through-hole and a second frame body which is disposed on an upper surface of the first frame body and defines an interior portion as a fourth through-hole which is greater than the third through-hole, and a clearance is disposed on a position overlaid with the second frame body in a top transparent view of the electronic element mounting substrate.

5. The electronic element mounting substrate according to claim 1,
wherein the first wiring substrate comprises an electronic element connection pad disposed on the upper surface, and the electronic element connection pad is disposed at such a position not to be overlaid with the clearance in a top transparent view of the electronic element mounting substrate.

6. The electronic element mounting substrate according to claim 1,
wherein the first wiring substrate and the second wiring substrate are connected via an external circuit connection member, the first wiring substrate and the metal plate are connected via a bonding material, and a total thickness in a vertical direction of the second wiring substrate and the external circuit connection member is equal to a total thickness in a vertical direction of the metal plate and the bonding material.

7. An electronic device, comprising:
the electronic element mounting substrate according to claim 1; and
an electronic element which is mounted on the electronic element mounting portion of the metal plate.

8. The electronic element mounting substrate according to claim 1,
wherein a bonding material is disposed:
between an outer periphery of the upper surface of the metal plate and the lower surface of the first wiring substrate; and
in the clearance between the side surface of the metal plate and the side surface of the second wiring substrate on the metal plate side.

* * * * *